United States Patent
Turner

(10) Patent No.: US 12,143,092 B2
(45) Date of Patent: *Nov. 12, 2024

(54) TRANSVERSELY-EXCITED FILM BULK ACOUSTIC RESONATORS AND FILTERS WITH TRAP-RICH LAYER

(71) Applicant: Murata Manufacturing Co., Ltd., Nagaokakyo (JP)

(72) Inventor: Patrick Turner, San Bruno, CA (US)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 106 days.

This patent is subject to a terminal disclaimer.

(21) Appl. No.: 17/956,807

(22) Filed: Sep. 29, 2022

(65) Prior Publication Data

US 2023/0027140 A1    Jan. 26, 2023

Related U.S. Application Data

(63) Continuation of application No. 17/692,083, filed on Mar. 10, 2022, which is a continuation of application
(Continued)

(51) Int. Cl.
*H03H 9/02* (2006.01)
*H03H 9/205* (2006.01)
*H03H 9/54* (2006.01)

(52) U.S. Cl.
CPC .......... *H03H 9/02228* (2013.01); *H03H 9/02015* (2013.01); *H03H 9/205* (2013.01); *H03H 9/54* (2013.01)

(58) Field of Classification Search
CPC .......... H03H 9/02228; H03H 9/02015; H03H 9/205; H03H 9/54
(Continued)

(56) References Cited

U.S. PATENT DOCUMENTS

| 5,705,399 A | 1/1998 | Larue |
| 5,853,601 A | 12/1998 | Krishaswamy et al. |

(Continued)

FOREIGN PATENT DOCUMENTS

| CN | 113765495 A | 12/2021 |
| JP | 2002300003 A | 10/2002 |

(Continued)

OTHER PUBLICATIONS

T. Takai, H. Iwamoto, et al., "I.H.P.Saw Technology and its Application to Microacoustic Components (Invited)." 2017 IEEE International Ultrasonics Symposium, Sept. 6-9, 2017. Pages 1-8.

(Continued)

*Primary Examiner* — Hafizur Rahman
(74) *Attorney, Agent, or Firm* — ARENTFOX SCHIFF LLP

(57) ABSTRACT

Acoustic resonator devices and filters are disclosed. An acoustic resonator includes a substrate and a piezoelectric plate having parallel front and back surfaces. The substrate includes a silicon base having a trap-rich region adjacent to a surface and a dielectric layer on the surface. The back surface of the piezoelectric plate faces the dielectric layer. The piezoelectric plate comprises a diaphragm that spans a cavity in the substrate. An interdigital transducer (IDT) is provided on the front surface of the piezoelectric plate such that interleaved fingers of the IDT are on the diaphragm.

20 Claims, 7 Drawing Sheets

Related U.S. Application Data

No. 16/989,710, filed on Aug. 10, 2020, now Pat. No. 11,323,089, which is a continuation-in-part of application No. 16/438,121, filed on Jun. 11, 2019, now Pat. No. 10,756,697, which is a continuation-in-part of application No. 16/230,443, filed on Dec. 21, 2018, now Pat. No. 10,491,192.

(60) Provisional application No. 62/951,452, filed on Dec. 20, 2019, provisional application No. 62/753,815, filed on Oct. 31, 2018, provisional application No. 62/748,883, filed on Oct. 22, 2018, provisional application No. 62/741,702, filed on Oct. 5, 2018, provisional application No. 62/701,363, filed on Jul. 20, 2018, provisional application No. 62/685,825, filed on Jun. 15, 2018.

(58) Field of Classification Search
USPC .......................................................... 333/187
See application file for complete search history.

(56) References Cited

U.S. PATENT DOCUMENTS

| | | |
|---|---|---|
| 6,540,827 B1 | 4/2003 | Levy et al. |
| 6,707,229 B1 | 3/2004 | Martin |
| 7,042,132 B2 | 5/2006 | Bauer et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,802,466 B2 | 9/2010 | Whalen et al. |
| 7,868,519 B2 | 1/2011 | Umeda |
| 8,278,802 B1 | 10/2012 | Lee et al. |
| 8,344,815 B2 | 1/2013 | Yamanaka |
| 8,829,766 B2 | 9/2014 | Milyutin et al. |
| 8,932,686 B2 | 1/2015 | Hayakawa et al. |
| 9,130,145 B2 | 9/2015 | Martin et al. |
| 9,219,466 B2 | 12/2015 | Meltaus et al. |
| 9,240,768 B2 | 1/2016 | Nishihara et al. |
| 9,276,557 B1 | 3/2016 | Nordquist et al. |
| 9,369,105 B1 | 6/2016 | Li |
| 9,425,765 B2 | 8/2016 | Rinaldi |
| 9,525,398 B1 | 12/2016 | Olsson |
| 9,564,873 B2 | 2/2017 | Kadota |
| 9,748,923 B2 | 8/2017 | Kando et al. |
| 9,780,759 B2 | 10/2017 | Kimura et al. |
| 10,200,013 B2 | 2/2019 | Bower et al. |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,756,697 B2 | 8/2020 | Plesski et al. |
| 10,790,802 B2 | 9/2020 | Yantchev et al. |
| 10,797,675 B2 | 10/2020 | Plesski |
| 10,819,309 B1 | 10/2020 | Turner et al. |
| 10,819,319 B1 | 10/2020 | Hyde |
| 10,826,462 B2 | 11/2020 | Plesski et al. |
| 10,868,510 B2 | 12/2020 | Yantchev |
| 10,868,512 B2 | 12/2020 | Garcia et al. |
| 10,985,728 B2 | 4/2021 | Plesski et al. |
| 11,146,232 B2 | 10/2021 | Yandrapalli et al. |
| 11,201,601 B2 | 12/2021 | Yantchev et al. |
| 11,206,007 B2* | 12/2021 | Inoue ................... H03H 3/10 |
| 11,309,861 B2* | 4/2022 | Inoue ............... H03H 9/14564 |
| 11,323,089 B2* | 5/2022 | Turner ............... H03H 9/02015 |
| 11,418,167 B2 | 8/2022 | Garcia |
| 2002/0079986 A1 | 6/2002 | Ruby et al. |
| 2002/0158714 A1 | 10/2002 | Kaitila et al. |
| 2003/0199105 A1 | 10/2003 | Kub et al. |
| 2004/0261250 A1 | 12/2004 | Kadota et al. |
| 2005/0099091 A1 | 5/2005 | Mishima et al. |
| 2006/0125489 A1 | 6/2006 | Feucht et al. |
| 2006/0222568 A1 | 10/2006 | Wang et al. |
| 2007/0115079 A1 | 5/2007 | Kubo et al. |
| 2007/0188047 A1 | 8/2007 | Tanaka et al. |
| 2007/0194863 A1 | 8/2007 | Shibata et al. |
| 2007/0278898 A1 | 12/2007 | Miura et al. |
| 2010/0064492 A1 | 3/2010 | Tanaka |
| 2010/0123367 A1 | 5/2010 | Tai et al. |
| 2010/0301703 A1 | 12/2010 | Chen et al. |
| 2011/0102107 A1 | 5/2011 | Onzuka |
| 2011/0109196 A1 | 5/2011 | Goto |
| 2011/0278993 A1 | 11/2011 | Iwamoto |
| 2013/0015353 A1 | 1/2013 | Tai et al. |
| 2013/0234805 A1 | 9/2013 | Takahashi |
| 2013/0321100 A1 | 12/2013 | Wang |
| 2014/0009032 A1 | 1/2014 | Takahashi et al. |
| 2014/0113571 A1 | 4/2014 | Fujiwara et al. |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0014795 A1 | 1/2015 | Franosch et al. |
| 2015/0319537 A1 | 11/2015 | Perois et al. |
| 2015/0333730 A1 | 11/2015 | Meltaus |
| 2016/0028367 A1 | 1/2016 | Shealy |
| 2016/0182009 A1 | 6/2016 | Bhattacharjee |
| 2016/0285430 A1 | 9/2016 | Kikuchi et al. |
| 2017/0063332 A1 | 3/2017 | Gilbert et al. |
| 2017/0179928 A1 | 6/2017 | Raihn et al. |
| 2017/0214387 A1 | 7/2017 | Burak et al. |
| 2017/0222622 A1* | 8/2017 | Solal .................. H03H 9/02574 |
| 2017/0264266 A1 | 9/2017 | Kishimoto et al. |
| 2017/0290160 A1 | 10/2017 | Takano et al. |
| 2017/0370791 A1 | 12/2017 | Nakamura et al. |
| 2018/0013405 A1 | 1/2018 | Takata |
| 2018/0123016 A1 | 5/2018 | Gong et al. |
| 2018/0152169 A1 | 5/2018 | Goto et al. |
| 2018/0191322 A1 | 7/2018 | Chang et al. |
| 2018/0309426 A1 | 10/2018 | Guenard et al. |
| 2019/0007022 A1 | 1/2019 | Goto et al. |
| 2019/0068155 A1 | 2/2019 | Kimura et al. |
| 2019/0068164 A1 | 2/2019 | Houlden et al. |
| 2019/0131953 A1 | 5/2019 | Gong |
| 2019/0181833 A1 | 6/2019 | Nosaka |
| 2019/0207583 A1 | 7/2019 | Miura et al. |
| 2019/0245518 A1 | 8/2019 | Ito |
| 2019/0273480 A1 | 9/2019 | Lin |
| 2019/0386638 A1 | 12/2019 | Kimura et al. |
| 2020/0228087 A1 | 7/2020 | Michigami et al. |
| 2020/0274520 A1 | 8/2020 | Shin et al. |
| 2020/0304091 A1 | 9/2020 | Yantchev |
| 2020/0321939 A1 | 10/2020 | Turner et al. |
| 2021/0273631 A1 | 9/2021 | Jachowski et al. |
| 2021/0313951 A1 | 10/2021 | Yandrapalli et al. |
| 2022/0103160 A1 | 3/2022 | Jachowski et al. |
| 2022/0116015 A1 | 4/2022 | Garcia et al. |
| 2022/0123720 A1 | 4/2022 | Garcia et al. |
| 2022/0123723 A1 | 4/2022 | Garcia et al. |
| 2022/0149808 A1 | 5/2022 | Dyer et al. |
| 2022/0149814 A1 | 5/2022 | Garcia et al. |

FOREIGN PATENT DOCUMENTS

| | | |
|---|---|---|
| JP | 2007329584 A | 12/2007 |
| JP | 2010062816 A | 3/2010 |
| JP | 2018166259 A | 10/2018 |
| JP | 2018207144 A | 12/2018 |
| JP | 2019186655 A | 10/2019 |
| JP | 2020113939 A | 7/2020 |
| WO | 2015098694 A1 | 7/2015 |
| WO | 2016017104 | 2/2016 |
| WO | 2018003273 A1 | 1/2018 |
| WO | 2018163860 A1 | 9/2018 |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

(56) References Cited

OTHER PUBLICATIONS

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.
Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.
USPTO/ISA, International Search Report and Written Opinion for PCT Application No. PCT/US2019/036433 dated Aug. 29, 2019.
USPTO/ISA, International Search Report and Written Opinion for PCT Application No. PCT/US2019/058632 dated Jan. 17, 2020.
G. Manohar, "Investigation of Various Surface Acoustic Wave Design Configurations for Improved Sensitivity." Doctoral dissertation, University of South Florida, USA, Jan. 2012, 7 pages.
Ekeom, D. & Dubus, Bertrand & Volatier, A.. (2006). Solidly mounted resonator (SMR) FEM-BEM simulation. 1474-1477. 10.1109/ULTSYM.2006.371.
Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.
Naumenko et al., "Optimal orientations of Lithium Niobate for resonator SAW filters", 2003 IEEE Ultrasonics Symposium-pp. 2110-2113. (Year: 2003).
Webster Dictionary "Meaning of diaphragm" Merriam Webster since 1828.
Safari et al. "Piezoelectric for Transducer Applications" published by Elsevier Science Ltd., pp. 4 (Year: 2000).
Moussa et al. Review on Triggered Liposomal Drug Delivery with a Focus on Ultrasound 2015, Bentham Science Publishers, pp. 16 (Year 2005).
"Acoustic Properties of Solids" ONDA Corporation, 592 Weddell Drive, Sunnyvale, CA 94089, Apr. 11, 2003, pp. 5 (Year 2003).
Bahreynl, B., "Fabrication and Design of Resonant Microdevices" Andrew William, Inc. 2018, NY (Year 2008).
Material Properties of Tibtech Innovations, @ 2018 TIBTECH Innovations (Year 2018).
Bousquet, Marie e al. "Single-mode high frequency LiNbO3 Film Bulk Acoustic Resonator," 2019 IEEE International Ultrasonics Symposium (IUS), Glasgow, Scotland, Oct. 6-9, 2019, pp. 84-87.
Wikipedia contributors, "Quartz crystal microbalance," Wikipedia, The Free Encyclopedia, https://en.wikipedia.org/w/index.php?title=Quartz_crystal_microbalance&oldid=1009990186 (accessed Apr. 9, 2021).
Yantchev, Ventsislav & Katardjiev, Ilia. (2013). Thin film Lamb wave resonators in frequency control and sensing applications: A review. Journal of Micromechanics and Microengineering. 23. 043001. 10.1088/0960-1317/23/4/043001.
Wei Pang et al. "Analytical and experimental study on the second harmonic mode response of a bulk acoustic wave resonator" 2010 J. Micromech. Microeng. 20 115015; doi:10.1088/0960-1317/20/11/115015.
Durmus et al. "Acoustic-Based Biosensors" Encyclopedia of Microfluidics and Nanofluidics. DOI 10.1007/978-3-642-27758-0_10-2 Springer Science+Business Media New York 2014.
Chen et al., "Development and Application of SAW Filter," Micromachines, Apr. 20, 2022, vol. 13, No. 656, pp. 1-15.
Hermann et al., "Properties of shear-horizontal surface acoustic waves in different layered quartz-SiO2 structures," Ultrasonics, 1999, vol. 37, pp. 335-341.
Lam et al., "A Review of Lame and Lamb Mode Crystal Resonators for Timing Applications and Prospects of Lame and Lamb Mode Piezo MEMS Resonators for Filtering Applications," 2018 International Symposium on Acoustic Wave Devices for Future Mobile Communication Systems, Mar. 6-7, 2018, 12 pages.
Kadota et al., "Ultra-Wideband Ladder Filter Using SH0 Plate Wave in Thin LiNbO3 Plate and Its Application to Tunable Filter", IEEE Transactions on Ultrasonics, Ferroelectrics, and Frequency Control, vol. 62, No. 5, May 2015, pp. 939-946.
Abass et al. "Effects of inhomogeneous grain size distribution in polycrystalline silicon solar cells", Energy Procedia 10(2011) pp. 55-60, Year: 2011 Published by Elsevier Ltd.
Gnewuch et al. "Broadband monolithic acousto-optic tunable filter", Mar. 1, 2000 / vol. 25, No. 5 / Optics Letters.
Reinhardt, "Acoustic filters based on thin single crystal LiNbO3 films: status and prospects", 2014 IEEE International Ultrasonics Symposium Proceedings, pp. 773-781.

\* cited by examiner

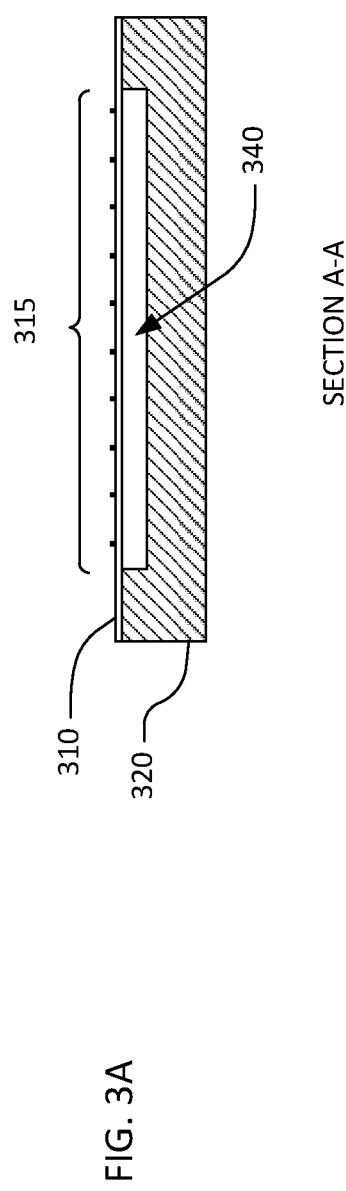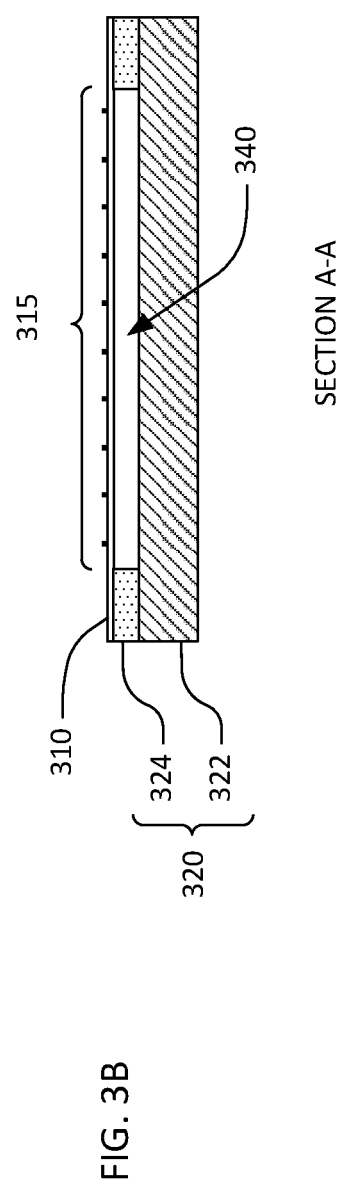

TRANSVERSELY-EXCITED FILM BULK ACOUSTIC RESONATORS AND FILTERS WITH TRAP-RICH LAYER

RELATED APPLICATION INFORMATION

This patent is a continuation of patent application Ser. No. 17/692,083, filed Mar. 10, 2020, entitled FILTER USING PIEZOELECTRIC FILM BONDED TO HIGH RESISTIVITY SILICON SUBSTRATE WITH TRAP-RICH LAYER, which is a continuation of patent application Ser. No. 16/989,710, filed Aug. 10, 2020 entitled FILTER USING PIEZOELECTRIC FILM BONDED TO HIGH RESISTIVITY SILICON SUBSTRATE WITH TRAP-RICH LAYER, now U.S. Pat. No. 11,323,089, which claims priority to provisional patent application 62/951,452, filed Dec. 20, 2019, entitled PIEZOELECTRIC FILM BONDED TO HIGH RESISTIVITY SILICON HAVING TRAP-RICH LAYER FOR RF FILTERS. Application 16/989,710 is a continuation in part of application Ser. No. 16/438,121. filed Jun. 11, 2019, entitled TRANSVERSELY-EXCITED FILM BULK ACOUSTIC RESONATOR, which is a continuation-in-part of application Ser. No. 16/230,443, filed Dec. 21, 2018, entitled TRANSVERSELY-EXCITED FILM BULK ACOUSTIC RESONATOR, now U.S. Pat. No. 10,491,192, which claims priority from the following provisional patent applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed October 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR. All of these applications are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ (Long Term Evolution) specification defines frequency bands from 3.3 GHz to 5.9 GHz. Some of these bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave BAW) resonators, film bulk acoustic wave resonators (FBAR), and other types of acoustic resonators. However, these existing technologies are not well-suited for use at the higher frequencies proposed for future communications networks.

DESCRIPTION OF THE DRAWINGS

FIG. 3A is an alternative schematic cross-sectional view of the XBAR of FIG. 1.

FIG. 3B is an alternative schematic cross-sectional view of the XBAR of FIG. 1.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
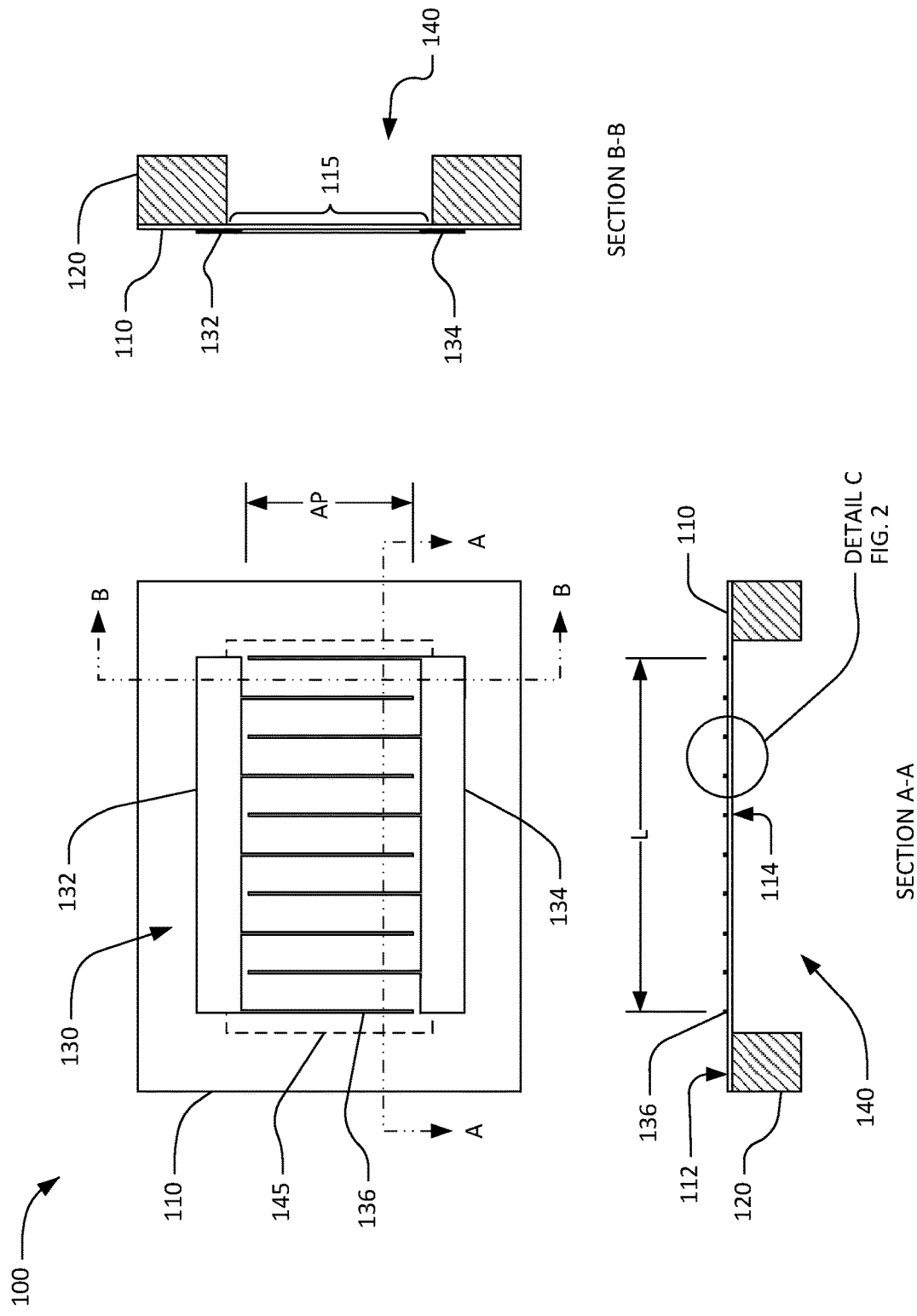
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the front and back surfaces 112, 114. However, XBARs may be fabricated on piezoelectric plates with other crystallographic orientations including rotated Z-cut and rotated YX cut.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item".

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers.

"Cavity" has its conventional meaning of "an empty space within a solid body." The cavity 140 may be a hole completely through the substrate 120 (as shown in Section A-A and Section B-B) or a recess in the substrate 120 (as shown subsequently in FIG. 3A and FG. 3B). The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate that spans, or is suspended over, the cavity 140. As shown in FIG. 1, the cavity 140 has a rectangular cross section with an extent greater than the aperture AP and length L of the IDT 130. A cavity of an XBAR may have a different cross-sectional shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT. An XBAR may have hundreds, possibly thousands, of parallel fingers in the IDT. Similarly, the thickness of the fingers in the cross-sectional views is greatly exaggerated.

Figure 2:
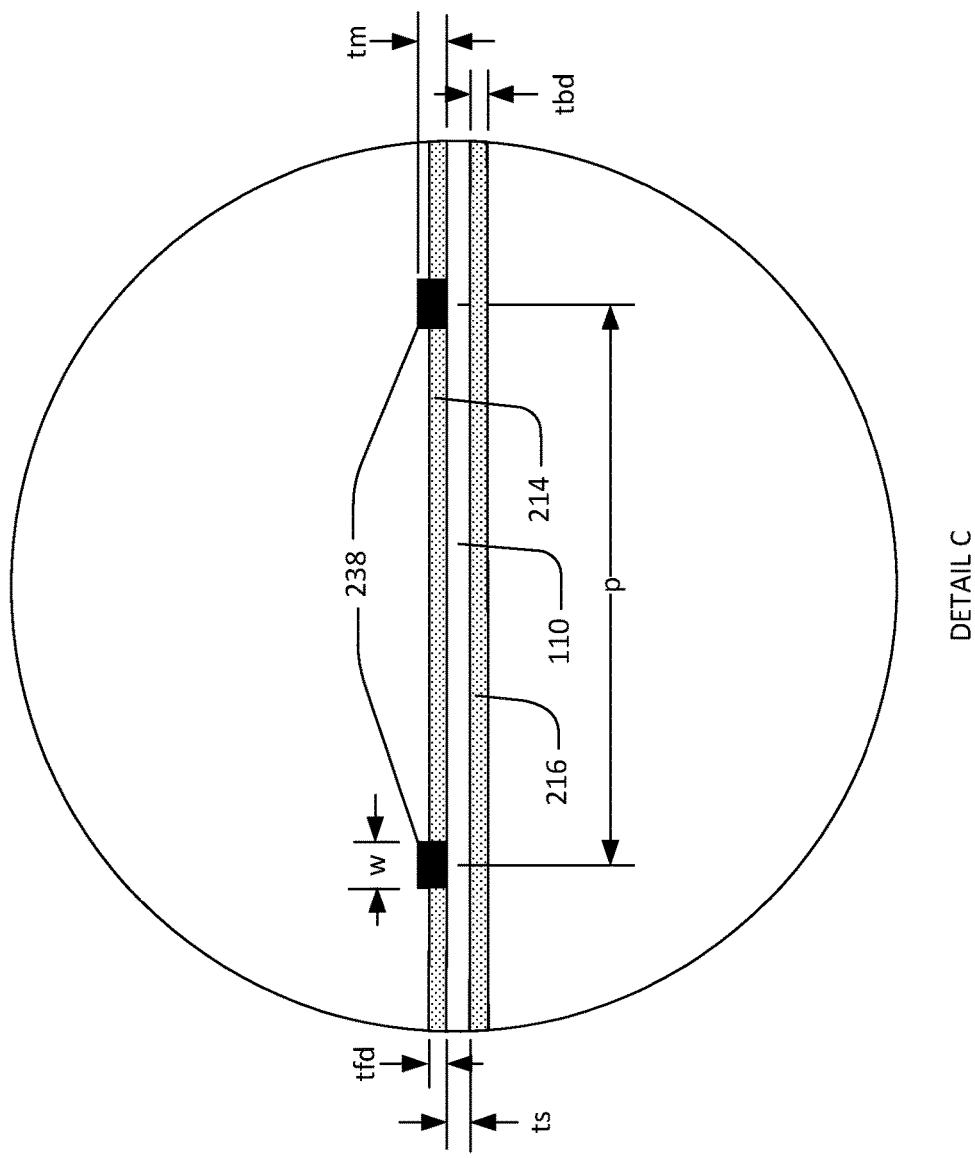
FIG. 2 is an expanded schematic cross-sectional view of a portion of the XBAR of FIG. 1.

FIG. 2 shows a detailed schematic cross-sectional view of the XBAR 100 of FIG. 1. The piezoelectric plate 110 is a single-crystal layer of piezoelectrical material having a thickness ts. ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The IDT fingers 238 may be aluminum, substantially aluminum alloys, copper, substantially copper alloys, beryllium, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric plate 110. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

FIG. 3A and FIG. 3B show two alternative cross-sectional views along the section plane A-A defined in FIG. 1. In FIG. 3A, a piezoelectric plate 310 is attached to a substrate 320. A cavity 340, which does not fully penetrate the substrate 320, is formed in the substrate under the portion of the piezoelectric plate 310 containing the IDT of an XBAR. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings provided in the piezoelectric plate 310.

In FIG. 3B, the substrate 320 includes a base 322 and an intermediate layer 324 disposed between the piezoelectric plate 310 and the base 322. For example, the base 322 may be silicon and the intermediate layer 324 may be silicon dioxide or silicon nitride or some other material. A cavity 340 is formed in the intermediate layer 324 under the portion of the piezoelectric plate 310 containing an XBAR. The cavity 340 may be formed, for example, by etching the intermediate layer 324 before attaching the piezoelectric plate 310. Alternatively, the cavity 340 may be formed by etching the intermediate layer 324 with a selective etchant that reaches the substrate through one or more openings (not shown) provided in the piezoelectric plate 310. In this case, the diaphragm 315 may be contiguous with the rest of the piezoelectric plate 310 around a large portion of a perimeter of the cavity 340. For example, the diaphragm 315 may be contiguous with the rest of the piezoelectric plate 310 around at least 50% of the perimeter of the cavity 340.

Figure 4:
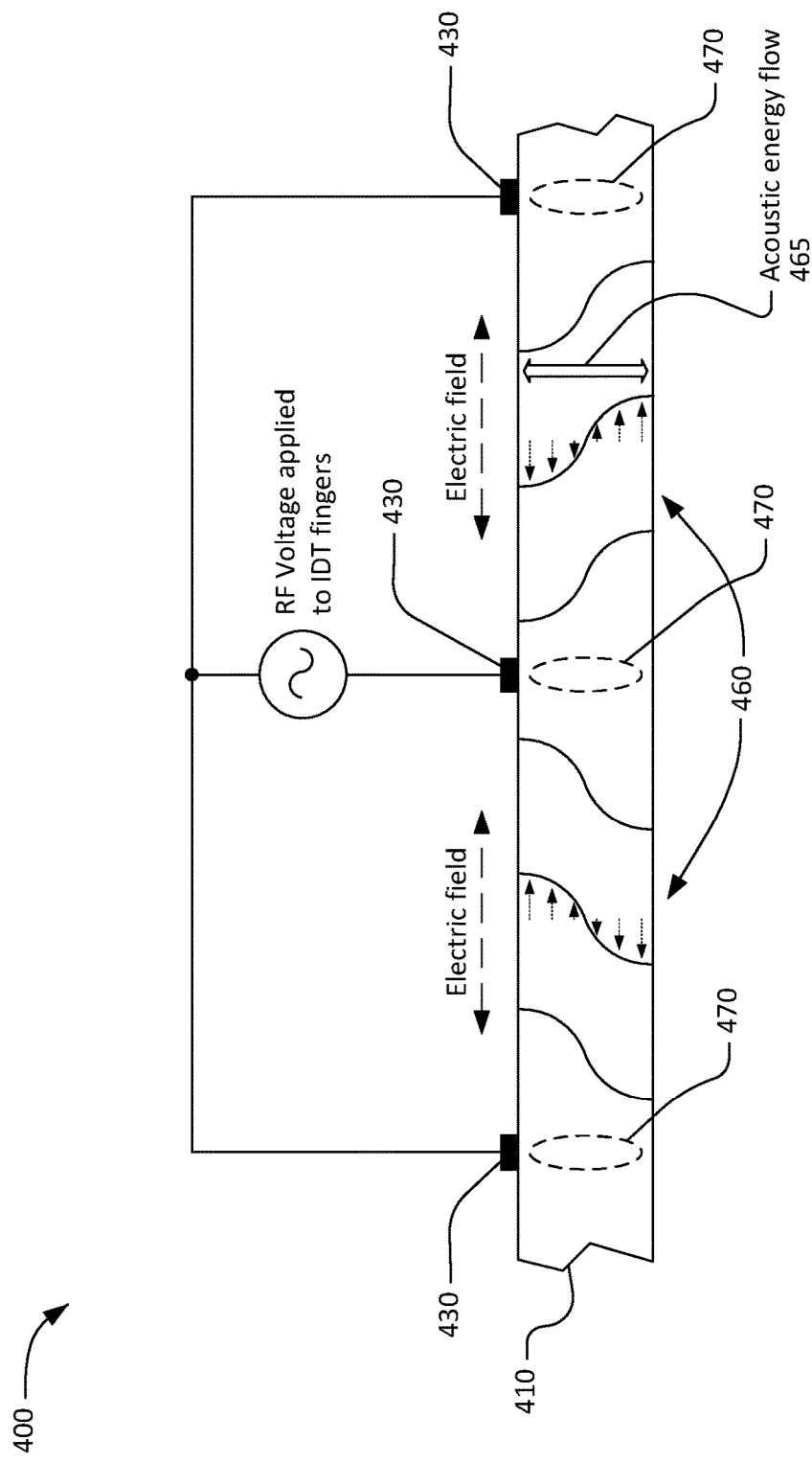
FIG. 4 is a graphic illustrating a shear horizontal acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430. An RF voltage is applied to the interleaved fingers 430. This voltage creates a time-varying electric field between the fingers. The direction of the electric field is lateral, or parallel to the surface of the piezoelectric plate 410, as indicated by the arrows labeled "electric field". Due to the high dielectric constant of the piezoelectric plate, the electric field is highly concentrated in the plate relative to the air. The lateral electric field introduces shear deformation, and thus strongly excites a shear-mode acoustic mode, in the piezoelectric plate 410. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 400 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary shear acoustic mode is substantially orthogonal to the surface of the piezoelectric plate, as indicated by the arrow 465.

Considering FIG. 4, there is essentially no electric field immediately under the IDT fingers 430, and thus acoustic modes are only minimally excited in the regions 470 under the fingers. There may be evanescent acoustic motions in these regions. Since acoustic vibrations are not excited under the IDT fingers 430, the acoustic energy coupled to the IDT fingers 430 is low (for example compared to the fingers of an IDT in a SAW resonator), which minimizes viscous losses in the IDT fingers.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. Thus, high piezoelectric coupling enables the design and implementation of microwave and millimeter-wave filters with appreciable bandwidth.

Figure 5:
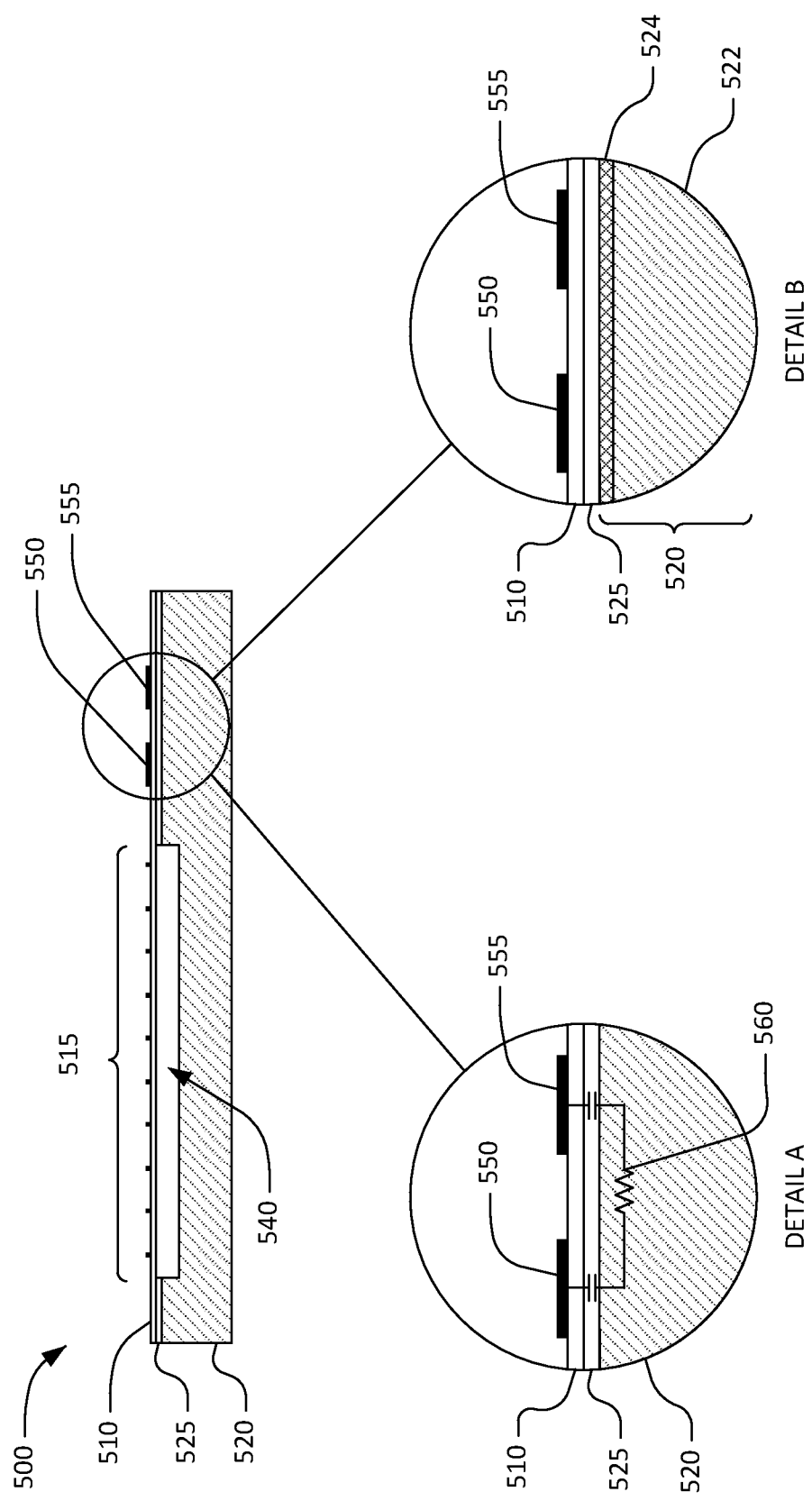
FIG. 5 is schematic cross-sectional view and two detailed cross-sectional views of a filter using XBARs.

FIG. 5 shows a schematic cross-sectional view and two detailed cross-sectional views of a filter 500 using XBARs. A piezoelectric plate 510 is attached to a substrate 520. An optional dielectric layer 525 may be sandwiched between the piezoelectric plate 510 and the substrate 520. A portion of the piezoelectric plate 510 forms a diaphragm 515 spanning a cavity 540 in the substrate. As shown, the cavity 540 does not fully penetrate the substrate 520. Alternatively, the cavity 540 may penetrate the substrate as shown in FIG. 1. Fingers of an IDT are disposed on the diaphragm 515. Two conductors 550 and 555 are formed on the surface of the piezoelectric plate 510 at a location removed from the cavity 540. The two conductors 550, 555 may be signal conductors interconnecting XBARs and/or other components of the filter 500. The conductors 550 and 555 may be a signal conductor and a ground conductor. While FIG. 5 only shows a single XBAR and two conductors, a filter may include multiple XBARs and more than two signal and ground conductors.

A preferred material for the substrate 520 is silicon. Silicon wafers are readily available and inexpensive. Further, processes and equipment for handling silicon wafers are well developed. However, silicon is a semiconductor material. Silicon wafers may be doped, or loaded with impurities, to have a desired bulk resistivity. Undoped, or intrinsic, silicon wafers can form a conductive inversion layer along the boundary between the silicon and some other material, such as along the boundary of the silicon wafer 520 and the dielectric layer 525 of the filter device 500. If the dielectric layer 525 is not present, the inversion layer may form along the boundary between the silicon wafer 520 and the piezoelectric plate 510.

As shown in Detail A of FIG. 5, conductors 550 and 555 are capacitively coupled to the substrate 520 through the piezoelectric plate 510 and the dielectric layer 525, if present. If the substrate 520 is conductive, or if a conductive inversion layer is formed in the substrate 520, the conductors 550, 555 will be effectively connected, at RF frequencies, by a parasitic resistance 560. Power dissipated in the resistance 560 will contribute to the insertion loss of the filter 500.

Figure 6:
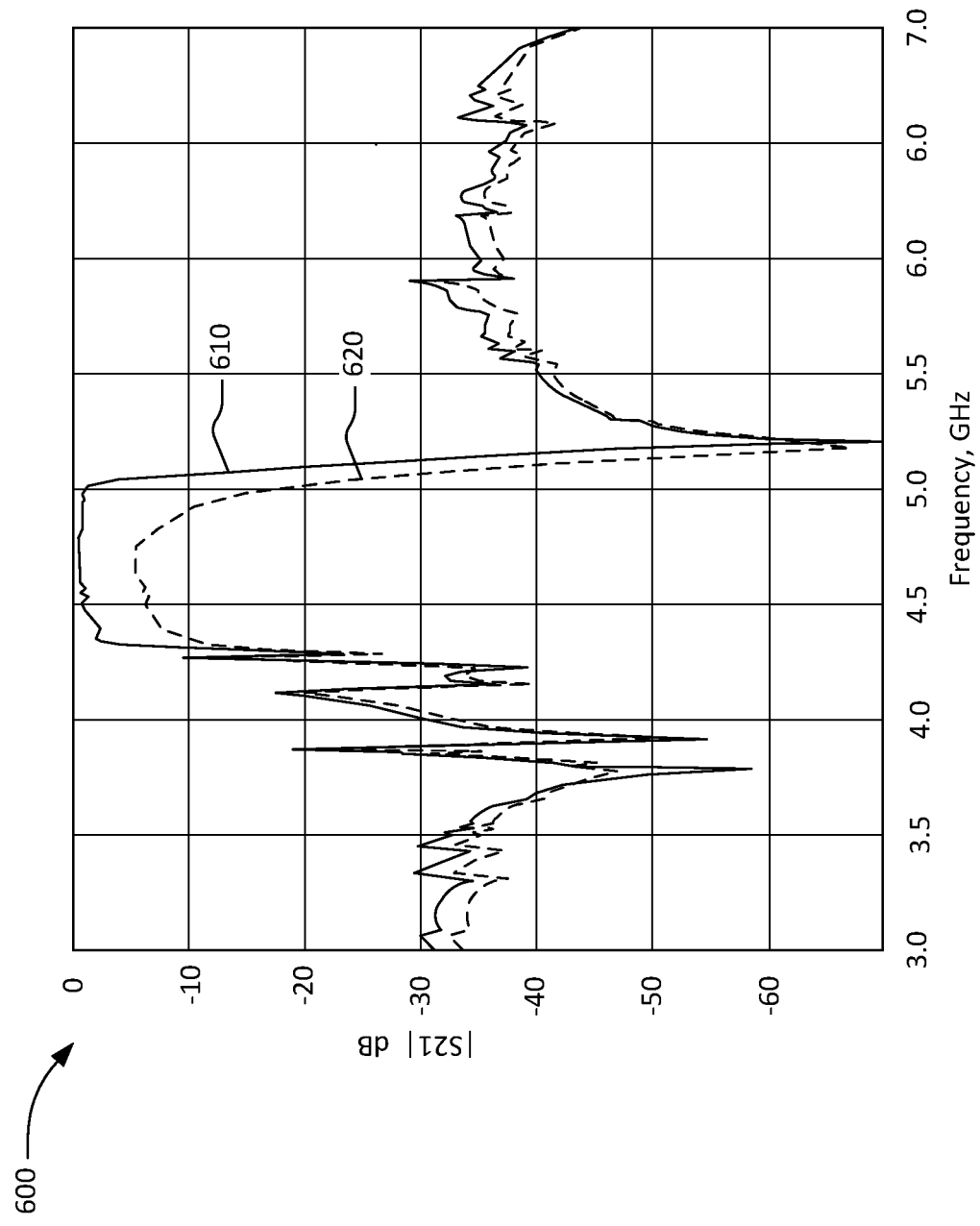
FIG. 6 is a chart comparing the input/output transfer functions of filters fabricated using high resistivity and low resistivity substrates.

FIG. 6 shows an exaggerated example of the degradation of a filter due to substrate conductivity. FIG. 6 is a plot of the magnitude of S21 (the input-output transfer function) versus frequency for two filters that are identical except for the choice of substrate material. The solid line 610 is a plot of S21 for a filter fabricated on a nearly insulating silicon substrate with a bulk resistivity of 5000 ohm-cm. The dashed line 620 is a plot of S21 for a filter fabricated on conductive silicon substrate with a bulk resistivity of 15 ohm-cm. Both plots are based on simulation of the filter using a finite element method. The difference in the two filters is evident. Substrate conductivity decreases S21 (i.e. increases insertion loss) by 6 dB or more in the filter passband. The effect of a conductive inversion layer in a high resistivity substrate will have a less dramatic, but still significant, effect on insertion loss.

Referring back to FIG. 5, detail B shows a cross-sectional view of a portion of a filter formed on a substrate 520 including a high resistivity silicon wafer 522 and a trap-rich region 524. The trap rich region 524 may be a region within the high resistivity silicon wafer 522 or a layer formed on a surface of the high resistivity silicon wafer 522. In either case, the trap-rich region is immediately adjacent the dielectric layer 525 or the piezoelectric plate 510 if the dielectric layer 525 is not present. The trap-rich region 522 has an abundance of traps that capture free carriers and reduce carrier lifetime to an extent that the conductivity of the trap-rich region approaches zero.

A trap-rich region may be formed within a silicon substrate by irradiating the surface of the substrate with neutrons, protons, or various ions (silicon, argon, nitrogen, neon, oxygen, etc.) to create defects in the crystalline structure of the substrate. Alternatively, a trap-rich region may be formed within a silicon substrate by introducing deep trap impurities such as gold, copper, or other metal ions. Such impurities may be introduced by ion implantation, diffusion, or some other method. The trap-rich region may be formed by a combination of these techniques. When the dielectric layer 525 is included in the filter 500, the trap-rich region 524 may be formed before the dielectric layer is formed on the substrate 520. Alternatively, the trap-rich region 524 may be form by ion implantation through the dielectric layer 525.

A trap-region layer may be formed on a silicon substrate by depositing a layer of trap-rich material such as amorphous silicon or polysilicon (polycrystalline silicon). When the trap-rich region is polysilicon, the average grain size of the polysilicon should be substantially smaller than the minimum spacing between electrodes 550, 555. The thickness of the trap rich region formed on or within a high resistivity silicon substrate should be greater than the thickness of an inversion layer that may form in the absence of the trap-rich layer.

Description of Methods

Figure 7:
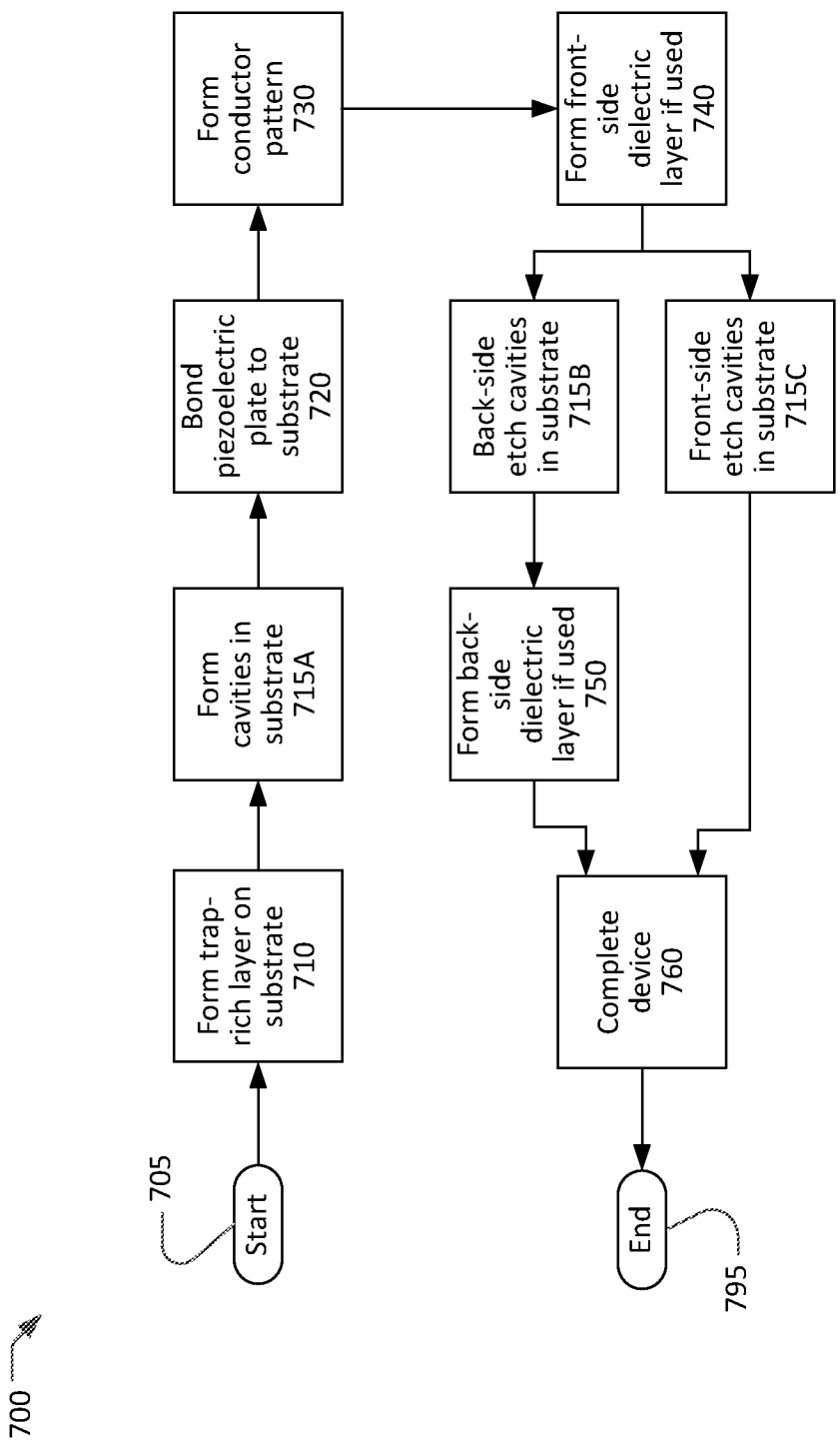
FIG. 7 is a flow chart of a process for fabricating a filter on a piezoelectric plate bonded to a silicon substrate having a trap-rich layer.

FIG. 7 is a simplified flow chart showing a process 700 for making a filter incorporating XBARs and a substrate with a trap-rich region. The process 700 starts at 705 with a substrate and a plate of piezoelectric material and ends at 795 with a completed XBAR or filter. The flow chart of FIG. 7 includes only major process steps. Various conventional process steps (e.g. surface preparation, cleaning, inspection, baking, annealing, monitoring, testing, etc.) may be performed before, between, after, and during the steps shown in FIG. 7.

The flow chart of FIG. 7 captures three variations of the process 700 for making an XBAR which differ in when and how cavities are formed in the substrate. The cavities may be formed at steps 715A, 715B, or 715C. Only one of these steps is performed in each of the three variations of the process 700.

The piezoelectric plate may be, for example, Z-cut lithium niobate or lithium tantalate. The piezoelectric plate may be rotated Z-cut or rotated YX cut lithium niobate. The piezoelectric plate may be some other material and/or some other cut. The substrate may preferably be high resistivity silicon. The substrate may be some other material that allows formation of deep cavities by etching or other processing.

At 710, a trap-rich region may be formed on the substrate. The trap-rich region may be formed within a silicon substrate by irradiating the surface of the substrate with neutrons, protons, or various ions (silicon, argon, nitrogen, neon, oxygen, etc.) to disrupt the crystalline structure of the substrate. The trap-rich region may be formed within a silicon substrate by introducing deep trap impurities such as gold, copper, or other metal ions. Such impurities may be introduced by ion implantation, diffusion, or some other method. The trap-rich region may be formed by a combination of these techniques. When the dielectric layer 525 is included in the filter 500, the trap-rich region 524 may be formed before the dielectric layer is formed on the substrate 520. Alternatively, the trap-rich region 524 may be formed by ion implantation through the dielectric layer 525, Alternatively, at 710, a trap-rich region may be formed on the silicon substrate by depositing a layer of trap-rich material such as amorphous silicon or polysilicon. When the trap-rich region is polysilicon, the average grain size of the polysilicon should be substantially smaller than the minimum spacing between electrodes 550, 555.

In all cases, the thickness of the trap rich region formed at 710 should be greater than the thickness of an inversion layer that may form in the absence of the trap-rich region.

In one variation of the process 700, one or more cavities are formed in the substrate at 715A before the piezoelectric plate is bonded to the substrate at 720. A separate cavity may be formed for each resonator in a filter device. The one or more cavities may be formed using conventional photolithographic and etching techniques. Typically, the cavities formed at 715A will not penetrate through the substrate, and the resulting resonator devices will have a cross-section as shown in FIG. 3A or FIG. 3B.

At 720, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 730 by depositing and patterning one or more conductor layer on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metals may be formed over portions of the conductor pattern (for example the IDT bus bars and interconnections between the IDTs).

The conductor pattern may be formed at 730 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 730 using a lift-off process. Photoresist may be deposited over the piezoelectric plate and patterned to define the conductor pattern. The conductor layer and, optionally, one or more other layers may be deposited in sequence over the surface of the piezoelectric plate. The photoresist may then be removed, which removes the excess material, leaving the conductor pattern.

At 740, a front-side dielectric layer may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate.

In a second variation of the process 700, one or more cavities are formed in the back side of the substrate at 715B. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1.

In the second variation of the process 700, a back-side dielectric layer may be formed at 750. In the case where the cavities are formed at 715B as holes through the substrate, the back-side dielectric layer may be deposited through the cavities using a conventional deposition technique such as sputtering, evaporation, or chemical vapor deposition.

In a third variation of the process 700, one or more cavities in the form of recesses in the substrate may be formed at 715C by etching the substrate using an etchant introduced through openings in the piezoelectric plate. A separate cavity may be formed for each resonator in a filter device. The one or more cavities formed at 715C will not penetrate through the substrate, and the resulting resonator devices will have a cross-section as shown in FIG. 3.

In all variations of the process 700, the filter device is completed at 760. Actions that may occur at 760 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 760 is to tune the resonant frequencies of the resonators within the device by adding or removing metal or dielectric material from the front side of the device. After the filter device is completed, the process ends at 795.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
    a substrate comprising:
        a silicon base having a surface, and
        a trap-rich region adjacent to the surface;
    a dielectric layer adjacent to the trap rich region;
    a piezoelectric layer having front and back surfaces, the back surface facing the dielectric layer, the piezoelectric layer including a diaphragm that is over a cavity; and
    an interdigital transducer (IDT) on the front surface of the piezoelectric layer such that interleaved fingers of the IDT are on the diaphragm.

2. The acoustic resonator device of claim 1, wherein at least a portion of the back surface of the piezoelectric layer is bonded to the dielectric layer.

3. The acoustic resonator device of claim 1, wherein the cavity is in the dielectric layer.

4. The acoustic resonator device of claim 1, wherein the dielectric layer is silicon dioxide.

5. The acoustic resonator device of claim 1, wherein the trap-rich region comprises at least one of a layer of amorphous silicon, a layer of polycrystalline silicon, a portion of the silicon base that contains deep trap impurities, and a portion of the silicon base that has been irradiated to create defects in the crystalline structure of the silicon base.

6. The acoustic resonator device of claim 5, wherein the trap-rich region is polycrystalline silicon, and an average grain size of the polycrystalline silicon is smaller than a minimum spacing between the fingers.

7. The acoustic resonator device of claim 1, wherein a depth, normal to the surface, of the trap-rich region is greater than a depth of an inversion layer that would form in the silicon base in the absence of the trap-rich region.

8. The acoustic resonator device of claim 1, wherein the piezoelectric layer and the IDT are configured such that a radio frequency signal applied to the IDT excites a primary shear acoustic mode within the diaphragm.

9. The acoustic resonator device of claim 8, wherein the piezoelectric layer is one of lithium niobate and lithium tantalate.

10. The acoustic resonator device of claim 9, wherein the piezoelectric layer is one of Z-cut, rotated Z-cut, and rotated YX-cut.

11. A filter device, comprising:
    a plurality of bulk acoustic wave (BAW) devices that each comprise:
        a substrate comprising:
            a silicon base having a surface, and
            a trap-rich region adjacent to the surface;
        a dielectric layer adjacent to the surface;
        a piezoelectric layer having front and back surfaces, the back surface facing the dielectric layer, the piezoelectric layer comprising a diaphragm that is over a cavity; and
        a conductor pattern on the front surface and including an interdigital transducer (IDT) that is on the respective diaphragm.

12. The filter device of claim 11, wherein at least a portion of the back surface of the piezoelectric layer is bonded to the dielectric layer.

13. The filter device of claim 11, wherein the respective cavities of each of the plurality of BAW devices are in the respective dielectric layer.

14. The filter device of claim 11, wherein the dielectric layer of each of the plurality of BAW devices is silicon dioxide.

15. The filter device of claim 11, wherein the piezoelectric layer and the IDT of each of the plurality of BAW devices are configured such that a radio frequency signal applied to the respective IDT excites a primary shear acoustic mode within the diaphragm.

16. The filter device of claim 15, wherein the piezoelectric layer of each of the plurality of BAW devices is one of lithium niobate and lithium tantalate.

17. The filter device of claim 11, wherein a depth, normal to the surface, of the trap-rich region of each of the plurality of BAW devices is greater than a depth of an inversion layer that would form in the silicon base in the absence of the trap-rich region.

18. The filter device of claim 16, wherein the piezoelectric layer of each of the plurality of BAW devices is one of Z-cut, rotated Z-cut, and rotated YX-cut.

19. The filter device of claim 16, wherein the trap-rich region of each of the plurality of BAW devices comprises at least one of a layer of amorphous silicon, a layer of polycrystalline silicon, a portion of the silicon base that contains deep trap impurities, and a portion of the silicon base that has been irradiated to create defects in the crystalline structure of the silicon base.

20. The filter device of claim 19, wherein the trap-rich region of each of the plurality of BAW devices is polycrystalline silicon, and an average grain size of the polycrystalline silicon is smaller than a minimum spacing between the fingers.

* * * * *